US008354588B2

(12) United States Patent
Sticker et al.

(10) Patent No.: US 8,354,588 B2
(45) Date of Patent: Jan. 15, 2013

(54) COVERING FOR A SEPARABLE CONNECTION

(75) Inventors: Rolf Sticker, Donaueschingen (DE); Stefanie Palka, Blumberg (DE)

(73) Assignee: MC Technology GmbH, Blumberg (DE)

(*) Notice: Subject to any disclaimer, the term of this patent is extended or adjusted under 35 U.S.C. 154(b) by 601 days.

(21) Appl. No.: 12/588,858

(22) Filed: Oct. 30, 2009

(65) Prior Publication Data

US 2010/0108348 A1 May 6, 2010

(30) Foreign Application Priority Data

Nov. 4, 2008 (DE) ......................... 10 2008 055 789

(51) Int. Cl.
*H05K 5/03* (2006.01)

(52) U.S. Cl. ............. 174/67; 174/50; 220/3.2; 220/241; 220/242

(58) Field of Classification Search .................... 174/50, 174/53, 57, 58, 66, 67; 220/3.2–3.9, 4.02, 220/241, 242; 439/535, 536
See application file for complete search history.

(56) References Cited

U.S. PATENT DOCUMENTS

| | | | | |
|---|---|---|---|---|
| 4,721,476 | A * | 1/1988 | Zeliff et al. | 439/536 |
| 7,485,804 | B2 * | 2/2009 | Dinh et al. | 174/50 |
| 7,511,219 | B2 * | 3/2009 | Dinh et al. | 174/66 |
| 7,674,975 | B2 * | 3/2010 | Atkinson et al. | 174/66 |
| 7,850,031 | B2 * | 12/2010 | Mossner et al. | 220/4.02 |
| 2008/0264664 | A1 | 10/2008 | Dinh et al. | |

FOREIGN PATENT DOCUMENTS

| | | | |
|---|---|---|---|
| DE | 36 04 764 | A1 | 8/1987 |
| DE | 296 06 964 | U1 | 8/1996 |
| DE | 20 2005 002 397 | U1 | 6/2005 |
| DE | 103 50 433 | A1 | 7/2005 |
| GB | 2434 926 | A | 8/2007 |
| SU | 1394300 | A1 | 5/1988 |
| SU | 1803985 | A1 | 3/1993 |

OTHER PUBLICATIONS

Decision to Grant issued on Apr. 6, 2011, in parallel Russian Patent Application No. 2009140838.

* cited by examiner

*Primary Examiner* — Angel R Estrada
(74) *Attorney, Agent, or Firm* — Nath, Goldberg & Meyer; Jerald L. Meyer

(57) ABSTRACT

A covering for a plug and socket connection mounted in a housing is provided with a cover that covers the plug and socket connection in closed position and which is pivotable from the closed position into an open position in which it releases the plug and socket connection. The cover is mounted pivotable at a guide component. The guide component is mounted displaceable in a receptacle of the housing. In its open position, the cover is aligned with the guide component and can be inserted together with it into the receptacle.

13 Claims, 4 Drawing Sheets

COVERING FOR A SEPARABLE CONNECTION

Figure 1:
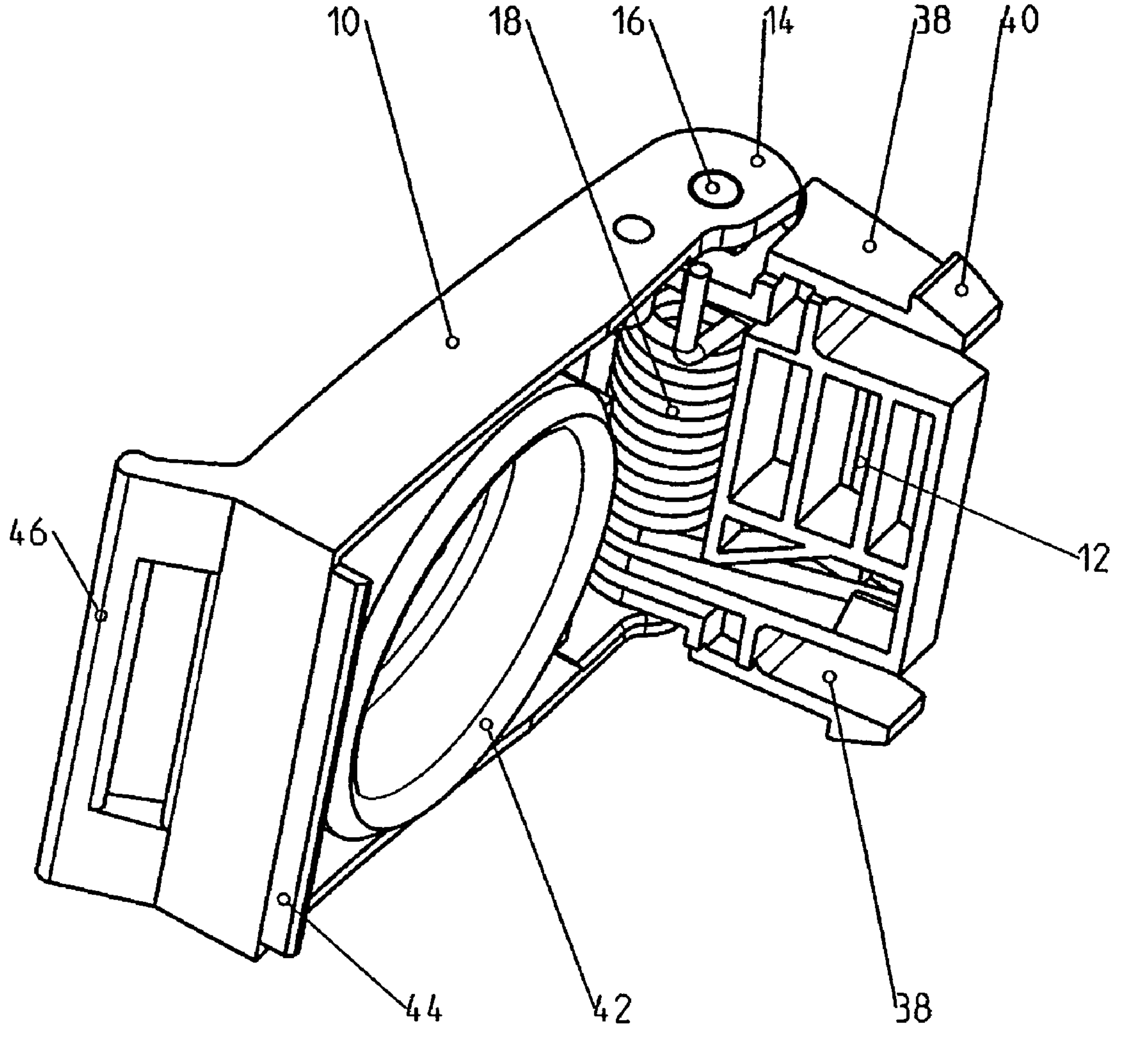

The invention concerns a covering for a first component of a separable connection that is mounted in a front of a housing, particularly an electrical plug and socket connection according to the generic term of claim 1.

To connect lines as needed and/or to be able to connect such, separable connections are used. Such lines can convey liquids, gases, pressure or vacuum. Particularly, such lines can be electrical lines for transmitting energy and/or data. The separable connections can be designed in various known embodiments, for example, as screw connections and particularly plug and socket connections. The separable connections consist of a first and a second component that are connected with each other and which can be separated from each other. In the case of plug and socket connections, these components are usually described as plug socket and plug connector.

In general, one component of a separable connection for electrical plug and socket connections, the socket, is as a rule, located in the front of a housing, while the other component of the connection is usually, in the case of electrical connections the plug, located at a line that is to be connected. The housing can be a device housing or the housing of a socket that can be inserted into the wall of a building, a cable channel or the like, however, it can also be designed as exposed socket. If such connections are used only as needed for connecting a line, while they are separated for longer periods of time, coverings are used in order to protect the component of the connection that is located in the housing from penetration of dirt or moisture. Such coverings are, for example, designed as a separate cover that can be stacked onto the component of the connection that is located in the housing and is often connected by a cord or chain with this first component or with the housing in order to make this cover captive. It is known further (e.g. DE 103 50 433 A1) to design the covering with a cover that is attached pivotable at the front of the housing and when the connection is not plugged it snaps onto the front side of the housing in order to cover that component of the connection. To plug the connection, the cover is pivoted into an open position in which it releases the component that is mounted in the housing so that the second component can be connected.

Both solutions have in common that in the case of a connected connection, the cover lies open unprotected so that dirt and moisture can deposit in the cover. If the covering is to be closed, it must therefore first be cleaned or the dirt and the moisture can penetrate from the cover into the connector component, for example, into the socket that is located in the housing. Covers that are mounted pivotable at the housing are usually preloaded into their closed position by the force of a spring. The cover must therefore be held pivoted away against this force of the spring for making a connection and for separating such, whereby the connection and the separation are impeded. Moreover, when the connection is plugged in, the cover always abuts, loaded by the force of its spring on the connected component of the connection or the connected line, whereby the connection is encumbered.

Therefore, the invention is based on the problem of creating a covering for a separable connection that avoids these disadvantages, that does not impede the connection and separation of the connection and is protected against dirt and moisture and the like in unused condition.

This problem is solved in accordance with the invention by a covering with the characteristics of claim 1.

Advantageous embodiments of the invention are indicated in the subordinate claims.

The essential idea of the invention consists of designing the covering in two parts, a cover and a guide component. The guide component is located in a receptacle of the housing and in this receptacle it is mounted displaceable at an insertion plane. To release the first component of the connection located in the housing, the cover is pivoted up from the front of the housing around its pivotable connection with the guide component until the cover is aligned with the guide component in the insertion plane. The cover can then be inserted into the receptacle together with the guide component. The cover is thus completely enclosed in the receptacle and protected against contamination. Moreover, the cover no longer projects from the front of the housing into the section of the plug and socket connection so that the cover does not impede the connecting and disconnecting of the connection and moreover, also does not abut on the connected, plugged connection. If the connection is separated, the cover and the guide component are pulled forward in the receptacle until the cover is completely pulled out of the receptacle and the pivotable connection between cover and guide component is anterior to the front of the housing. The cover can now be folded over into the closed position in which it covers the first component of the plug and socket connection in the housing.

The guide component remains as bracket of the cover in the receptacle of the housing. In this position, the covering essentially acts like the known covering with pivotable cover. The decisive difference is that the cover in accordance with the invention is not mounted pivotable at the housing, but at the guide component that can be inserted into the housing.

In the following, the invention is explained in more detail with the example of an embodiment illustrated in the drawing. Shown are:

FIG. 1 a perspective view of the covering,

FIG. 2*a*, the covering in three different functional positions [a] b and c, [Translator's note: a) is missing from source text]

Figure 3:
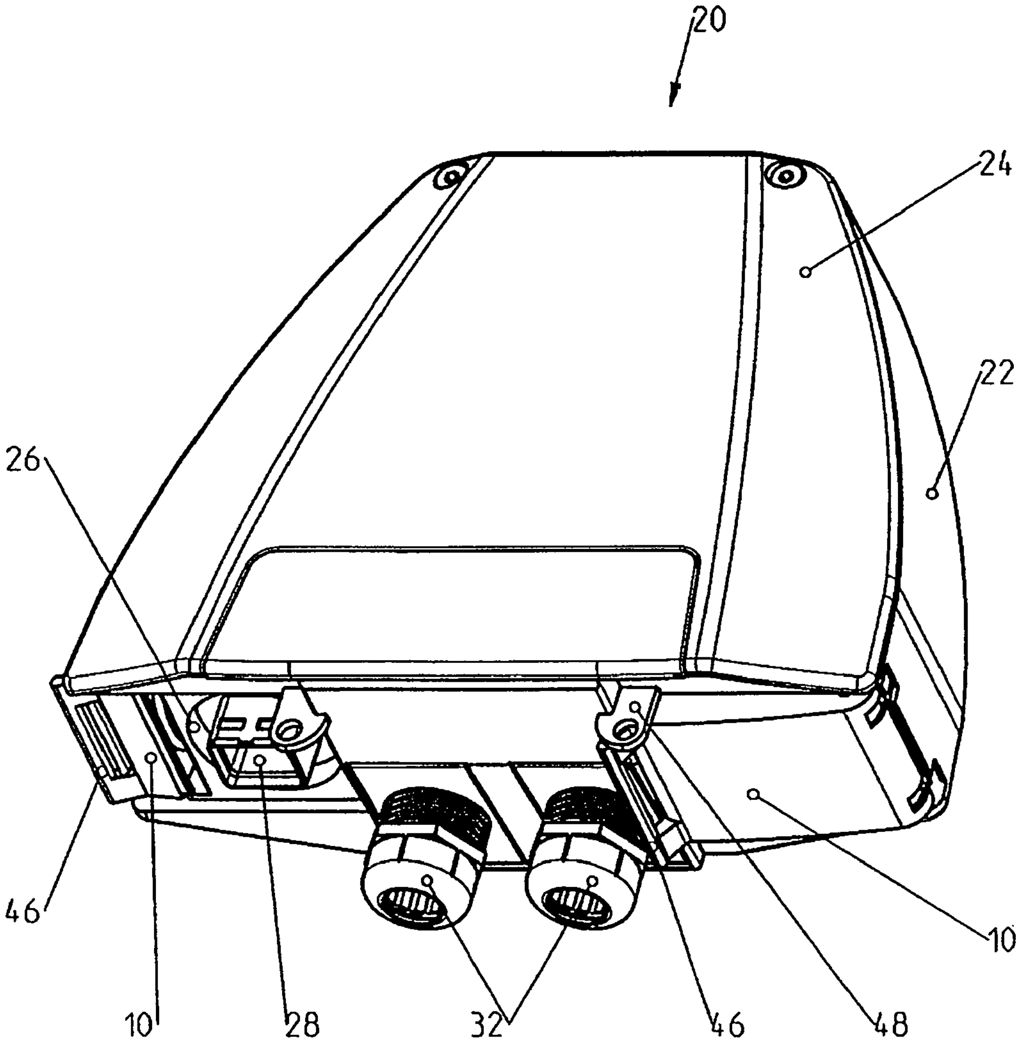
Figure 4:
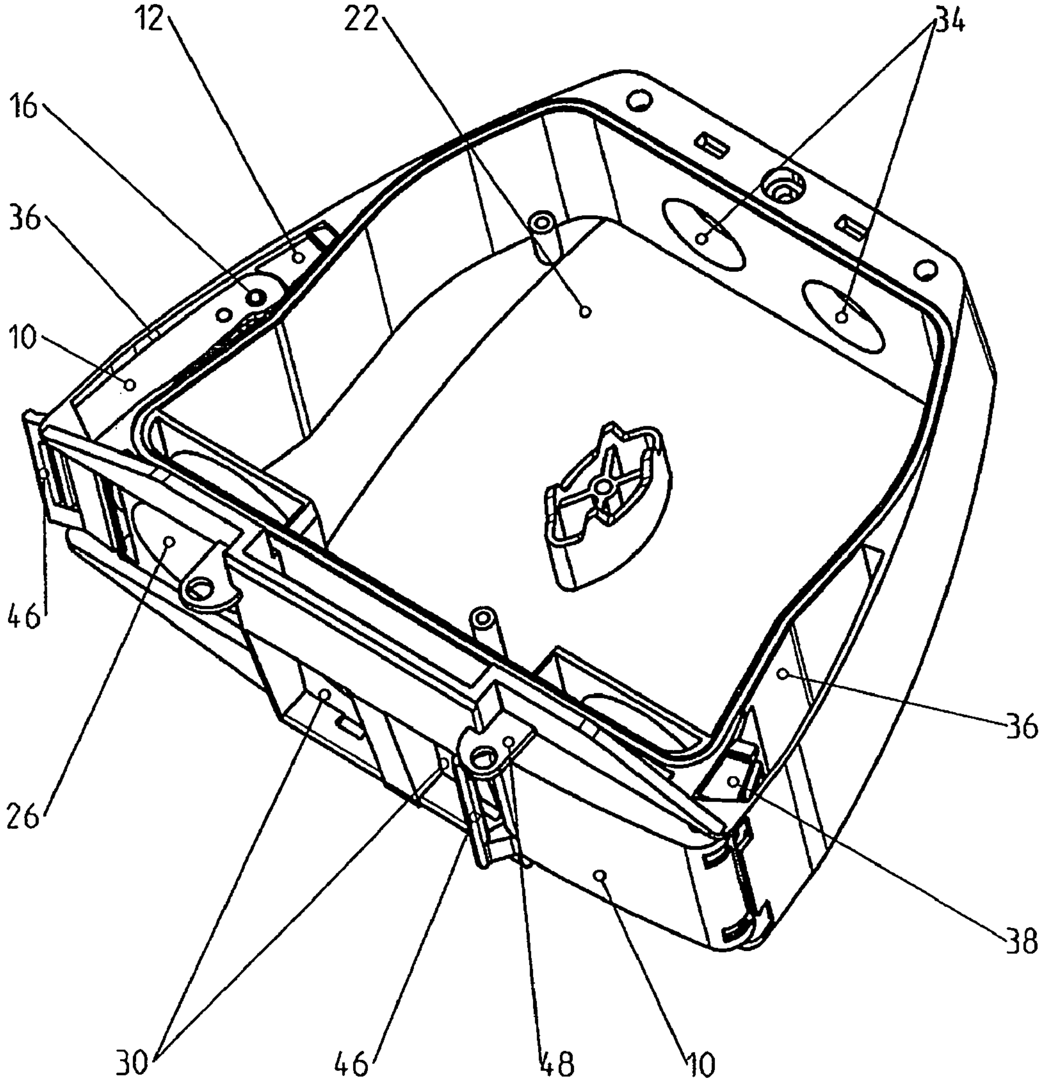

FIG. 3 a socket with two separable connections and coverings in accordance with the invention, and FIG. 4 the housing of the socket of FIG. 3 with removed upper component.

Figure 2:
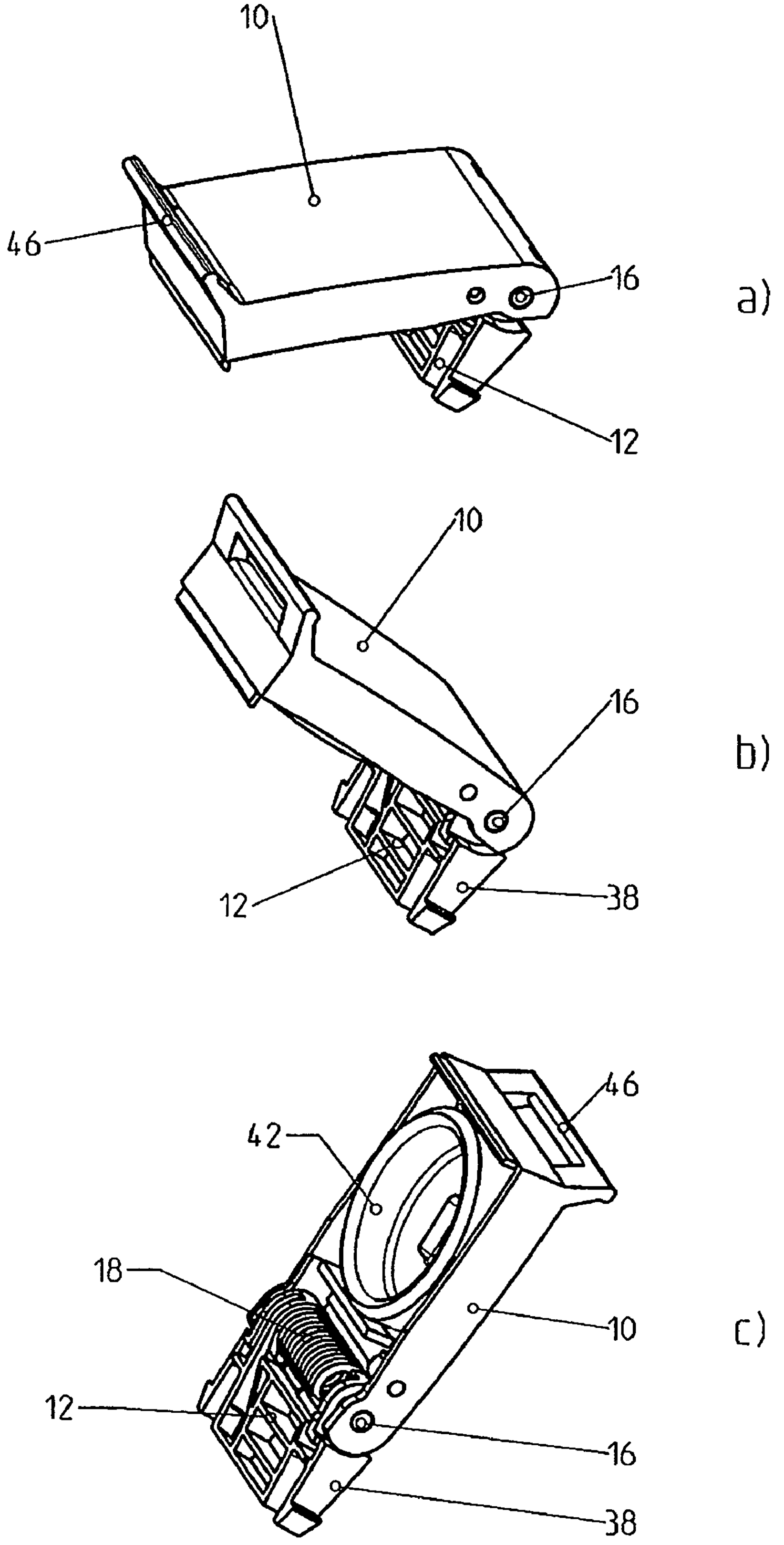

The covering shown in FIGS. 1 and 2 as an example of an embodiment has a cover 10 and a guide component 12. The cover 10 and the guide component 12 are preferably extruded plastic components. Cover 10 essentially has the form of a closed, oblong, flat, perhaps slightly concave plate. The guide component 12 also essentially has the form of a flat, particularly a slightly tapered plate, however, to save material, it has apertures. Cover 10 and guide component 12 have approximately the same width. The guide component 12 engages with a trans-verse edge between ears 14, which are formed at the end of the lateral edges of cover 10. Respectively formed on both sides of the guide component 12 are hinge pins 16 penetrating ears 14, so that cover 10 and guide component 12 are mounted pivotable against each other around these hinge pins 16 as axis of rotation. Coaxially to this pivoting axis, a bracket spring 18 is used, one bracket of which engages at cover 10 and its other bracket at guide component 12. The bracket spring 18 is preloaded in such a way that the force of its spring holds the cover 10 and the guide component 12 in a position at an angle in which cover 10 and guide component 12 make an angle that is smaller than 90°. This position is shown in FIG. 2*a*. In this position, the angle of rotation is limited by stops. The cover 10 and the guide component 12 can be rotated against the force of the spring of the bracket spring 18 up to a position as it is shown in FIG. 2*c*, in which the cover 10 and the guide component 12 are aligned with each other, i.e. the cover 10 and the guide component 12 lie in a joint plane. Preferably, the pivoting motion is limited by stops in this position as well.

The covering shown in FIGS. 1 and 2 is for covering a first component of a separable connection, which is located in the front of a housing.

In FIGS. 3 and 4, the application of the covering is shown by way of example for an electrical plug and socket connection, that is located in a housing for a wall outlet. The plug and socket connection is used, for example, for connecting data lines to a data network.

In the examples of an embodiment of FIGS. 3 and 4, the housing is designed as a flat socket 20 that can be mounted on a wall with a tub-shaped lower component 22 shown in FIG. 4. The lower component 22 is closed with an upper component 24, as can be seen in FIG. 3.

At the small front of socket 20, at the right and at the left, electrical plug and socket connections are provided respectively. For this purpose, the front wall of the lower component 22 is provided respectively on the right and on the left with a circular aperture 26, into which respectively plug socket 28 of a plug and socket connection can be inserted. Between the two apertures 26, the front wall of the lower component 22 is provided with recesses 30, into which cable entry points 32 are insertable. At the opposite posterior wall of the lower component 22, openings 34 are prepared in the event it is required to also insert cables into the socket 20 from this posterior side. Openings 34 can be designed as thinned out wall sections that are broken out when needed or that can be closed by a dummy plug when they are not needed. FIG. 3 shows the closed socket 20 with inserted plug sockets 28 and inserted cable entry points 32. In FIG. 4, the lower component 22 of the empty socket 20 is shown without the plug sockets 28 and the cable entry points 32.

To cover the plug sockets 28, the socket 20 is provided with covers respectively dedicated to the plug sockets 28 in the form shown in FIGS. 1 and 2. Thereby, in FIGS. 3 and 4 on the left side, the covering is respectively shown in the open position, in which the plug socket 28 is exposed for connecting a plug, and on the right side in the closed position, in which the plug socket 28 is covered.

The housing of the socket 20 is provided respectively with a receptacle 36 laterally next to the apertures 26 in the lateral wall of the lower component 22. The receptacle 36 is, as can be seen in FIG. 4, designed as a housing pocket that is formed in the lateral wall of the lower component 22. For this purpose, the lateral wall is designed double-walled in the section of the receptacle 36 and encloses the housing pocket between the double walls. The lateral walls of the lower component 22 with the receptacles 36 are attached essentially at a right angle to the front of the lower component 22, and thus laterally respectively to the sections of the front in which the apertures 26 are located.

The housing pockets serving as receptacles 36 are closed on the bottom by the bottom of the lower component 22 and at the longitudinal sides and the end edge by the lateral wall of the lower component 22. On the top side, the receptacle 36 are [Translator's note: No subject/verb agreement in original.] closed by the attached upper component 24 of the socket 20. Towards the front of socket 20, the housing pockets of the receptacles 36 are open by means of an entry slot. The height of this entry slot corresponds to the width of the cover 10 of the covering. The covering is slid into receptacles 36 with its guide component 12 through the entry slot on the front. At its lateral edges that run in the direction of insertion, the guide component 12 has respectively a spring tab 38 with a detent 40 that is aligned outward. The spring tabs 38 and the detents 40 are designed in such a way that the exterior surfaces of the spring tabs 38 are flush with the exterior side of cover 10, and the detents 40 project beyond this exterior surface. When guide component 12 is inserted through the entry slot into receptacle 36, the spring tabs 38 are pushed elastically toward the interior over an intake incline of detents 40, so that the guide component 12 can penetrate into the entry slot of the receptacle 36. As soon as the detents 40 are in the interior of receptacle 36, the spring tabs 38 can splay outward again. The guide component 12 is thereby accepted captive in the receptacle 36, as the detents 40 prevent that the guide component 12 is being pulled out through the entry slot of the receptacle 36.

When guide the component 12 is inserted into the receptacle 36, the cover 10 can be pivoted into the extended position aligned with the guide component 12 against the force of the bracket spring 18, which is shown in FIG. 2*c*. In this extended position, the guide component 12 and the cover 10 which is connected to it flush can be jointly inserted into the housing pocket of the receptacle 36, as is shown in FIG. 4 on the left. The length of the receptacle 36 is dimensioned in such a way that the guide component 12 of the cover 10 can be inserted completely into the receptacle 36.

If the cover 10 is pulled out of this position in the receptacle 36, the guide component 12 with the cover 10 is then also pulled forward against the front of the receptacle 36. As soon as, in this being pulled out, the pivoting axis formed by the hinge axis 16 is anterior to the front of the socket 20, the detents 40 of the guide components 12 come to the stop and prevent that the guide component 12 can also be pulled out of the receptacle 36. As the pivoting axis of the cover 10 and the guide component 12 is now exterior to the receptacle 36, the cover 10 can be pivoted with respect to the guide component 12 that is retained in the receptacle 36 by the force of the bracket spring 18 and comes to rest on the front of the socket 20 and thus closes the respective aperture 26 with the plug socket 28, as it is shown in FIGS. 3 and 4 on the right.

As can be seen most clearly in FIG. 1, the cover 10 is provided with a gasket 42 at its side that is facing the front of socket 20 in the closed position. In the closed position of the cover, which corresponds to the position shown in FIG. 2*b*, the gasket 42 is pressed against the front of the lower component 22 by the cover 10 that is preloaded by bracket spring 18, and places itself around the respective aperture 26 on this front side. As a result, the aperture 26 and thus the plug socket 28 is tightly sealed against the outside environment. The gasket 42 is adapted in its form to the respective aperture 26; in the illustrated example of an embodiment, it is circular.

Further, cover 10 has a seal 44 on its narrow edge opposite to its pivoting axis. These seals [Translator's note: No subject/verb agreement in original.] serves to seal the entry slot of the receptacle 36 when the cover 10 in its open position is completely inserted into the receptacle 36. As a result of the seal 44, the cover 10 that is inserted into the receptacle 36 is sealed against the exterior environment and protected against contamination and moisture.

Further, cover 10 is provided with a handle bar 46 at its narrow edge opposite to the pivoting axis that is mounted on the edge facing away from socket 20 in closed position. This handle bar 46 serves to lift the cover 10 out of the closed position against the force of the spring of the bracket spring 18 and to pivot it into the open position. Moreover, the handle bar 46 serves to grasp the cover 10 in order to be able to pull the cover 10 out of the receptacle 36 again.

Finally, in the lower component 22 of the housing there can, for example, also be an ear 48 or a similar arrangement, in order to fill the cover 10 at its opposite end to the pivoting axis in the closed position or to lock it, when an opening of the cover and use of the plug and socket connection by unauthorized persons is intended to be prevented.

In the example of an embodiment, the cover 10 and the guide component 12 are separate components that are connected pivotable by means of hinge axis 16. It can easily be seen that the cover 10 and the guide component 12 can also be designed in one piece and be connected pivotable with each other by an integral hinge.

Further, it can easily be seen that the covering in accordance with the invention can also be used for housings with only one connection or also for housings with more than two connections.

In the illustrated example of an embodiment, the housing is designed as socket. The covering in accordance with the invention can also be used for other forms of housing, for example, when a separable connection is inserted in the front of a device housing or a cable channel.

Finally, it can easily be seen that the covering in accordance with the invention is not only usable for electrical plug and socket connections, but in the same way, it is also usable for other separable connections, for example, screw connections or separable connections for non-electric lines.

LEGEND

10 cover
12 guide component
14 ears
16 hinge pin
18 bracket spring
20 socket
22 lower component
24 upper component
26 aperture
28 plug socket
30 recesses
32 cable entry points
34 openings
36 receptacle
38 spring tab
40 detent
42 gasket
44 seal
46 handle bar
48 ear

The invention claimed is:

1. Covering for a first component of a separable connection mounted in a front of a housing, particularly an electrical plug and socket connection, with a cover that is pivotable between a closed position and an open position, whereby the cover covers the first component of the connection in the closed position and, in the open position, it releases the first component for connecting a second component of the connection, wherein the cover is mounted pivotable at a guide component, which is located displaceable in a receptacle of the housing at an insertion plane, whereby the cover in its open position is aligned with the guide component in the insertion plane and is configured to be inserted jointly with the guide component into the receptacle until the cover is in the receptacle, whereby the guide component is configured to be pulled forward in the receptacle until the cover is completely outside of the receptacle and, with respect to the guide component, the cover is pivotable into the closed position, whereby the cover and the guide component have the form of flat plates that are connected with each other so that the cover and the guide component are pivotable around a pivoting axis running at the plate plane, and whereby the cover is preloaded into the closed position with respect to the guide component by force of a spring.

2. Covering according to claim 1, wherein the cover and the guide component are individual components, that are, for example, mounted on a pivoting axis formed by hinge pins so that they can be pivoted.

3. Covering according to claim 1, wherein the cover and the guide component are designed in one piece and are connected with each other by an integral hinge.

4. Covering according to claim 1, wherein the force of the spring is exerted by a bracket spring.

5. Covering according to claim 1, wherein the guide component is guided captive in the receptacle.

6. Covering according to claim 5, wherein the guide component is provided with at least one spring tab with detent, that forms a stop at the end of the pull-out motion of the guide component in the receptacle.

7. Covering according to claim 1, wherein the receptacle is oriented essentially perpendicular to the insertion plane extending along the front of the housing next to the first component of the connection.

8. Covering according to claim 1, wherein the receptacle is designed as a housing pocket.

9. Covering according to claim 1, wherein the cover is provided with a handle bar at its end that is facing away from the pivoting axis.

10. Covering according to claim 1, wherein the cover at its front that is facing the housing is provided with a gasket for sealed closing of the first component of the connection.

11. Covering according to claim 1, wherein the cover is provided with a seal at its edge that is facing away from the pivoting axis, which seals the entry slot of the receptacle when the cover is inserted into the receptacle in its open position.

12. Covering according to claim 1, wherein the cover can be connected to the housing in its closed position, can be locked or sealed.

13. Socket for at least one electrical plug and socket connector, wherein the component of the plug and socket connector that is located in the socket can be covered by a covering according to claim 1.

* * * * *